United States Patent
Oh

(10) Patent No.: US 7,838,979 B2
(45) Date of Patent: Nov. 23, 2010

(54) STACKED SEMICONDUCTOR PACKAGE ELECTRICALLY CONNECTING SEMICONDUCTOR CHIPS USING OUTER SURFACES THEREOF AND METHOD FOR MANUFACTURING THE SAME

(75) Inventor: Tac Keun Oh, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 12/207,860

(22) Filed: Sep. 10, 2008

(65) Prior Publication Data

US 2009/0321954 A1    Dec. 31, 2009

(30) Foreign Application Priority Data

Jun. 30, 2008    (KR) .................. 10-2008-0062907

(51) Int. Cl.
    *H01L 23/48*    (2006.01)
(52) U.S. Cl. .................. 257/686; 257/777; 257/723; 257/738; 257/773

(58) Field of Classification Search .............. 257/777, 257/686, 723, 738, 773
See application file for complete search history.

(56) References Cited

U.S. PATENT DOCUMENTS

| | | | |
|---|---|---|---|
| 5,093,708 A * | 3/1992 | Solomon | 257/700 |
| 2008/0083976 A1* | 4/2008 | Haba et al. | 257/686 |
| 2008/0083977 A1* | 4/2008 | Haba et al. | 257/686 |
| 2009/0026600 A1* | 1/2009 | Koon et al. | 257/686 |
| 2009/0039528 A1* | 2/2009 | Haba et al. | 257/777 |

* cited by examiner

*Primary Examiner*—Long Pham
(74) *Attorney, Agent, or Firm*—Ladas & Parry LLP

(57) ABSTRACT

A stacked semiconductor package and a method for manufacturing the same. The stacked semiconductor package includes a semiconductor chip module having two or more semiconductor chips which are stacked in the shape of steps. Each of the semiconductor chips includes pads located on an upper surface thereof and an inclined side surface connected with the upper surface. Connection patterns are formed in the shape of lines on the inclined side surfaces and the upper surfaces of the semiconductor chips to electrically connect pads of the semiconductor chips.

18 Claims, 11 Drawing Sheets

US 7,838,979 B2

STACKED SEMICONDUCTOR PACKAGE ELECTRICALLY CONNECTING SEMICONDUCTOR CHIPS USING OUTER SURFACES THEREOF AND METHOD FOR MANUFACTURING THE SAME

CROSS-REFERENCE TO RELATED APPLICATIONS

The present application claims priority to Korean patent application number 10-2008-0062907 filed on Jun. 30, 2008, which is incorporated herein by reference in its entirety.

BACKGROUND OF THE INVENTION

The present invention relates generally to a stacked semiconductor package and a method for manufacturing same, and more particularly to a stacked semiconductor package electrically connecting semiconductor chips without requiring the formation of through-electrodes or connective wires, and reducing the size of the semiconductor package.

Semiconductor chips suitable for storing and processing increasing amounts of data and semiconductor packages including such semiconductor chips have been developed.

Recently stacked semiconductor packages, each including two or more stacked semiconductor chips, have been disclosed in the art in an effort to increase the data storage capacity and the data processing speed of semiconductor packages.

In order to manufacture a stacked semiconductor package, processes for electrically connecting stacked semiconductor chips using conductive wires or forming through-electrodes in stacked semiconductor chips and then electrically connecting the through-electrodes with one another are required.

In the case of electrically connecting the stacked semiconductor chips using the conductive wires, spacers must be interposed between the semiconductor chips in order to prevent the conductive wires and the semiconductor chips from being short-circuited. This can be problematic because the volume of the stacked semiconductor package markedly increases when the spacers must be interposed between the semiconductor chips.

Electrically connecting the stacked semiconductor chips using the through-electrodes can be problematic as well. That is, since through-holes having a fine size must be defined in the semiconductor chips and the through-electrodes must be formed in the through-holes, manufacturing processes are complicated and the semiconductor chips are likely to be damaged while defining or forming the through-holes or the through-electrodes in the semiconductor chips.

SUMMARY OF THE INVENTION

Embodiments of the present invention include a stacked semiconductor package in which respective semiconductor chips are electrically connected using the outer surfaces of the semiconductor chips without forming conductive wires or through-electrodes, so that the volume of the stacked semiconductor package and the number of manufacturing processes can be decreased and the semiconductor chips are prevented from being damaged.

Also, embodiments of the present invention include a method for manufacturing the stacked semiconductor package.

In one embodiment of the present invention, a stacked semiconductor package comprises a semiconductor chip module having at least two semiconductor chips which are stacked in the shape of steps and each of which includes pads located on an upper surface thereof and an inclined side surface connected with the upper surface; and connection patterns formed in the shape of lines on inclined side surfaces and upper surfaces of the semiconductor chips to electrically connect pads of the semiconductor chips.

The inclined side surface includes a first inclined side surface and a second inclined side surface which faces away from the first inclined side surface.

An angle defined between the first inclined side surface and the upper surface is an obtuse angle, and an angle defined by the second inclined side surface and the upper surface is an acute angle.

The connection patterns include extension parts, which extend on the upper surface of the semiconductor chip placed uppermost in the semiconductor chip module, and ball land parts, which are formed on the extension parts.

The connection patterns further include connection members, which are connected to the ball land parts.

The semiconductor chips comprise the same kind of semiconductor chips having the same size.

Alternatively, the semiconductor chips comprise different kinds of semiconductor chips having the same size.

The stacked semiconductor package further comprises a substrate having a substrate body on which the semiconductor chip module is placed, connection pads which are located on an upper surface of the substrate body and are electrically connected with the connection members, and ball land patterns which are located on a lower surface of the substrate body, facing away from the upper surface.

The semiconductor chip module includes a first semiconductor chip module and a second semiconductor chip module, and the second inclined side surfaces of the first semiconductor chip module and the first inclined side surfaces of the second semiconductor chip module face each other.

The stacked semiconductor package further comprises a gap fill member, which fills a gap between the first and second semiconductor chip modules.

The stacked semiconductor package further comprises an additional semiconductor package positioned in a space defined between the second semiconductor chip module and the substrate.

The first and second semiconductor chip modules comprise memory semiconductor chips, and the additional semiconductor package comprises system semiconductor chips.

Alternatively, the additional semiconductor package includes stacked semiconductor chips each of which has the shape of a trapezoid such that an angle defined between the first inclined side surface and the upper surface and an angle defined between the second inclined side surface and the upper surface are obtuse angles.

An angle defined between the first inclined side surface and the upper surface is an obtuse angle, and an angle defined by the second inclined side surface and the upper surface is an obtuse angle.

The connection patterns include extension parts that extend on a lower surface, facing away from the upper surface, of the semiconductor chip placed lowermost in the semiconductor chip module, and ball land parts, which are formed on the extension parts.

The connection patterns further include connection members, which are connected to the ball land parts.

The semiconductor chips comprise the same kind of semiconductor chips having different sizes.

Alternatively, the semiconductor chips comprise different kinds of semiconductor chips having different sizes.

The stacked semiconductor package further comprises a substrate having a substrate body on which the semiconductor chip module is placed, connection pads which are located on an upper surface of the substrate body and are electrically connected with the connection members, and ball land patterns which are located on a lower surface of the substrate body, facing away from the upper surface.

The semiconductor chip module includes first through third semiconductor chip modules which are placed on the substrate, the first and the second semiconductor chip modules are placed on the substrate in the shape of pyramids, and the third semiconductor chip module is placed on the substrate in the shape of an inverted pyramid.

The stacked semiconductor packages further comprises a gap fill member interposed between the first and third semiconductor chip modules and between the second and third semiconductor chip modules.

The stacked semiconductor package further comprises a printed circuit board electrically connected with the ball land patterns of the third semiconductor chip module which face away from the substrate; and an additional semiconductor package connected to the printed circuit board.

The first through third semiconductor chip modules comprise memory semiconductor modules for storing data, and the additional semiconductor package comprises a system semiconductor package for processing data.

In another embodiment of the present invention, a method for manufacturing a stacked semiconductor package comprises the steps of forming a semiconductor chip module by stacking at least two semiconductor chips, each of which has a first inclined side surface and a second inclined side surface facing away from the first inclined side surface and pads located on an upper surface thereof, in the shape of steps such that the pads are exposed; and forming connection patterns in the type of lines on at least one of the first and second inclined side surfaces and the upper surface of each semiconductor chip to electrically connect pads located on the respective semiconductor chips.

Before the step of forming the semiconductor chip module, the method further comprises the step of individualizing the semiconductor chips having the pads from a wafer in the shape of parallelograms.

The step of forming the connection patterns comprises the steps of forming extension parts which extend on the upper surface of the semiconductor chip placed uppermost in the semiconductor chip module, and ball land parts which are branched from the extension parts; and forming connection members on the ball land parts.

Before the step of forming the connection members, the method further comprises the step of placing at least one semiconductor chip module on a substrate having connection pads which are electrically connected with the pads.

The semiconductor chip module comprises at least two semiconductor chip modules which are placed on the substrate such that the first inclined side surfaces of one semiconductor chip module face the second inclined side surfaces of the other semiconductor chip module.

The method further comprises the step of forming a gap fill member between the first and second inclined side surfaces of the adjoining semiconductor chip modules.

The method further comprises the step of placing at least one additional semiconductor package in a space defined between the semiconductor chip module and the substrate.

Before the step of forming the semiconductor chip module, the method further comprises the step of individualizing the semiconductor chips having the pads from a wafer in the shape of trapezoids.

The semiconductor chips have different sizes and are stacked in the shape of a pyramid.

The method further comprises the steps of placing semiconductor chip modules having the shape of pyramids on a substrate; and placing semiconductor chip modules having the shape of inverted pyramids in spaces defined on the substrate by the semiconductor chip modules having the shape of pyramids.

A gap fill member is interposed between the semiconductor chip modules placed in the shape of pyramids and the semiconductor chip module placed in the shape of an inverted pyramid.

An additional semiconductor package is placed on the semiconductor chip module which has the shape of an inverted pyramid.

DESCRIPTION OF SPECIFIC EMBODIMENTS

Hereafter, stacked semiconductor packages and methods for manufacturing the same according to specific embodiments of the present invention will be described with reference to the accompanying drawings. However, it is to be noted that the present invention is not limited to the following embodiments, and a person having ordinary knowledge in the art will appreciate that the present invention can be realized in a variety of different ways without departing from the technical concept of the present invention.

In a stacked semiconductor package according to an embodiment of the present invention, a plurality of stacked semiconductor chips can be electrically connected without using conductive wires or through-electrodes. To this end, the stacked semiconductor package includes a stacked semiconductor chip module and connection patterns for electrically connecting the plurality of semiconductor chips included in the stacked semiconductor chip module.

The stacked semiconductor package according to an embodiment of the present invention includes a plurality of stacked semiconductor chips. For example, the plurality of semiconductor chips are stacked to be staggered in the shape of steps. Each of the semiconductor chips includes pads formed on an upper surface thereof and at least one inclined side surface connected with the upper surface.

In order to electrically connect the respective pads of the stacked semiconductor chips having the shape of steps, connection patterns are formed on the inclined side surfaces and the upper surfaces of the semiconductor chips and have the shape of lines when viewed from the above.

Hereinbelow, stacked semiconductor packages according to various specific embodiments of the present invention will be described with reference to the accompanying drawings.

Figure 1:
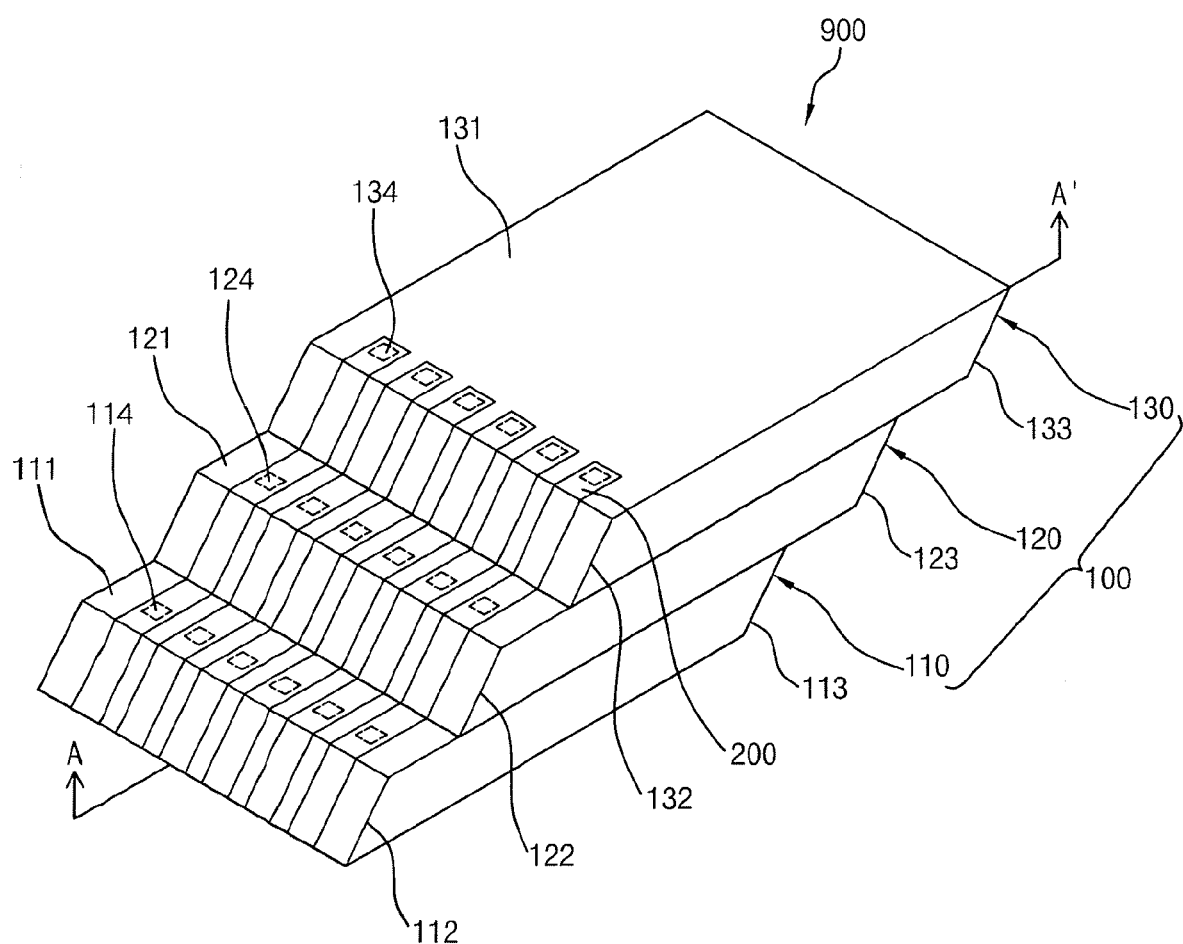
FIG. 1 is a perspective view showing a stacked semiconductor package in accordance with a first embodiment of the present invention.
Figure 2:
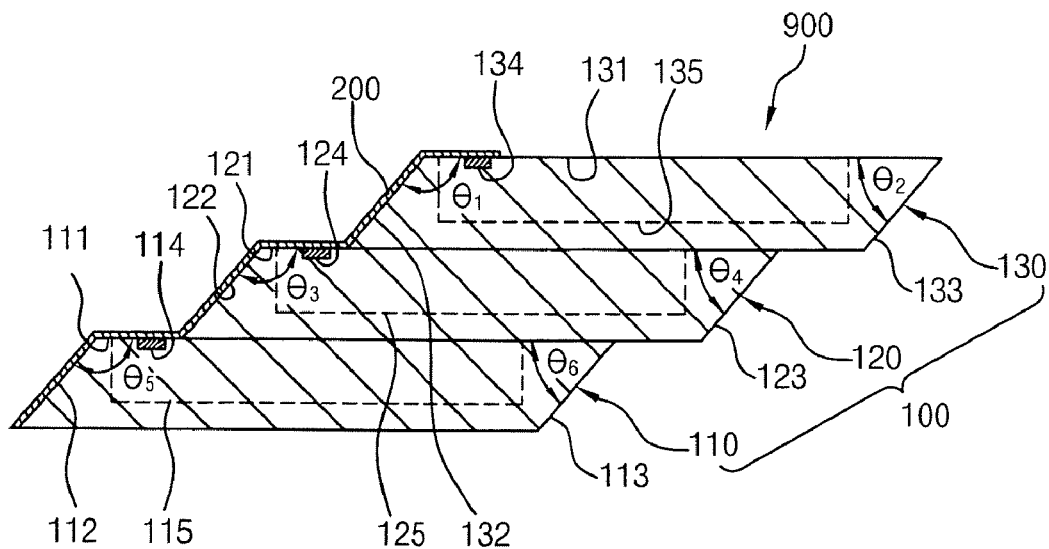
FIG. 2 is a cross-sectional view along the line A-A' of FIG. 1.

FIG. 1 is a perspective view showing a stacked semiconductor package in accordance with a first embodiment of the present invention. FIG. 2 is a cross-sectional view of FIG. 1 along the line A-A'.

Referring to FIGS. 1 and 2, a stacked semiconductor package 900 includes a semiconductor chip module 100 and connection patterns 200.

The semiconductor chip module 100 includes a plurality of semiconductor chips 110, 120, and 130. For example, in the present embodiment, the semiconductor chip module 100 includes three semiconductor chips 110, 120, and 130.

Hereinbelow, the three semiconductor chips 110, 120, and 130 included in the semiconductor chip module 100 are defined as a first semiconductor chip 110, a second semiconductor chip 120, and a third semiconductor chip 130.

For example, in the present embodiment, the first through third semiconductor chips 110, 120, and 130 may comprise the same kind of semiconductor chips, having the same size and the same shape. Alternatively, at least one of the first through third semiconductor chips 110, 120, and 130 may comprise a different kind of semiconductor chip having the same size and the same shape as the remaining semiconductor chips. For example, one of the first through third semiconductor chips 110, 120, and 130 may be a memory semiconductor chip for storing data, and the remaining semiconductor chips may be system semiconductor chips for processing data.

The embodiment as shown in FIGS. 1 and 2 will now be described with greater detail. The first semiconductor chip 110 has an upper surface 111 and at least one inclined side surface 112 which is connected with the upper surface 111. For example, in the present embodiment, the first semiconductor chip 110 has an upper surface 111 and two inclined side surfaces 112 and 113 which are connected with the upper surface 111. Hereinbelow, the two inclined side surfaces 112 and 113 will be defined as a first inclined side surface 112 and a second inclined side surface 113.

As shown in FIG. 2, the first inclined side surface 112 and the upper surface 111 are oriented such that the angle $\theta_1$ between the first inclined surface 112 and the upper surface is set as an obtuse angle, and the second inclined side surface 113 and the upper surface 111 are oriented such that the angle $\theta_2$ between the second inclined surface 113 and the upper surface 111 is set as an acute angle.

In the present embodiment, the first inclined side surface 112 and the second inclined side surface 113 may be parallel to each other. Accordingly, the first semiconductor chip 110 having the first and second inclined side surfaces 112 and 113 has a shape similar to a parallelogram. That is, the first and second inclined surfaces 112 and 113 are parallel to each other and the upper surface 111 is parallel to the surface opposite the upper surface 111.

Pads 114 are located on the upper surface 111 of the first semiconductor chip 110. For example, in the present embodiment, a plurality of pads 114 are located along an edge of the upper surface 111 adjacent to the first inclined side surface 112. As shown in FIG. 2, the pads 114 are electrically connected to a circuit section 115 of the first semiconductor chip 110.

In the present embodiment, in the case that the pads 114 are located centrally on the upper surface 111 of the first semiconductor chip 110, the pads 114 are electrically connected to first ends of re-distribution lines (not shown), and second ends of the re-distribution lines, which are opposite the first ends, extend to the edge of the upper surface 111, which is connected with the first inclined side surface 112 of the first semiconductor chip 110.

The second semiconductor chip 120 is placed on the first semiconductor chip 110 above the upper surface 111 of the first semiconductor chip 110 in the shape of a step, such that the pads 114 of the first semiconductor chip 110 are exposed from the second semiconductor chip 120.

The second semiconductor chip 120 has an upper surface 121 and at least one inclined side surface 122 which is connected with the upper surface 121. In the present embodiment, the second semiconductor chip 120 has an upper surface 121 and two inclined side surfaces 122 and 123 which are connected with the upper surface 121. Hereinbelow, the two inclined side surfaces 122 and 123 are defined as a first inclined side surface 122 and a second inclined side surface 123.

As shown in FIG. 2, the first inclined side surface 122 and the upper surface 121 are oriented such that the angle $\theta_3$ between the first inclined surface 122 and the upper surface 121 is set as an obtuse angle, and the second inclined side surface 123 and the upper surface 121 are oriented such that the angle $\theta_4$ between the second inclined 123 and the upper surface 121 is set as an acute angle. In the present embodiment, the first inclined side surface 122 and the second inclined side surface 123 may be parallel to each other. Accordingly, the second semiconductor chip 120 having the first and second inclined side surfaces 122 and 123 has a shape similar to a parallelogram. That is, the first and second inclined surfaces 122 and 123 are parallel to each other and the upper surface 121 is parallel to the surface opposite the upper surface 121.

Pads 124 are located on the upper surface 121 of the second semiconductor chip 120. In the present embodiment, a plurality of pads 124 are located along an edge of the upper surface 121 adjacent to the first inclined side surface 122. As shown in FIG. 2, the pads 124 are electrically connected to a circuit section 125 of the second semiconductor chip 120.

In the present embodiment, in the case that the pads 124 are located centrally on the upper surface 121 of the second semiconductor chip 120, the pads 124 are electrically connected to first ends of re-distribution lines (not shown), and second ends of the re-distribution lines, which face are opposite the first ends, extend to the edge of the upper surface 121, which is connected with the first inclined side surface 122 of the second semiconductor chip 120.

The third semiconductor chip 130 is placed on the second semiconductor chip 120 above the upper surface 121 of the second semiconductor chip 120 in the shape of a step, such that the pads 124 of the second semiconductor chip 120 are exposed by the third semiconductor chip 130.

The third semiconductor chip 130 has an upper surface 131 and at least one inclined side surface 132 which is connected with the upper surface 131. In the present embodiment, the third semiconductor chip 130 has an upper surface 131 and two inclined side surfaces 132 and 133 which are connected with the upper surface 131. Hereinbelow, the two inclined side surfaces 132 and 133 are defined as a first inclined side surface 132 and a second inclined side surface 133.

As shown in FIG. 2, the first inclined side surface 132 and the upper surface 131 are oriented such that the angle $\theta_5$ between the first inclined surface 132 and the upper surface 131 is set as an obtuse angle, and the side surface 133 and the upper surface 131 are oriented such that the angle $\theta_6$ between the second inclined surface 133 and the upper surface 131 is set as an acute angle. In the present embodiment, the first inclined side surface 132 and the second inclined side surface 133 may be parallel to each other.

Accordingly, the third semiconductor chip 130 having the first and second inclined side surfaces 132 and 133 has a shape similar to a parallelogram. That is, the first and second inclined surfaces 132 and 133 are parallel to each other and the upper surface 131 is parallel to the surface opposite the upper surface 131.

Pads 134 are located on the upper surface 131 of the third semiconductor chip 130. In the present embodiment, a plurality of pads 134 are located along an edge of the upper surface 131 adjacent to the first inclined side surface 132. As shown in FIG. 2, the pads 134 are electrically connected to a circuit section 135 of the third semiconductor chip 130.

In the present embodiment, in the case that the pads 134 are located centrally on the upper surface 131 of the third semiconductor chip 130, the pads 134 are electrically connected to first ends of re-distribution lines (not shown), and second ends of the re-distribution lines, which are opposite the first ends, extend to the edge of the upper surface 131, which is connected with the first inclined side surface 132 of the third semiconductor chip 130.

The connection patterns 200 electrically connect respective pads 114, 124, and 134 of the first through third semiconductor chips 110, 120, and 130, which are placed in the shape of steps, as shown in FIG. 1. The connection patterns 200 have the shape of lines when viewed from above. The connection patterns 200 may comprise a plated layer, conductive patterns formed by patterning a conductive layer, a conductive film, or the like.

Figure 3:
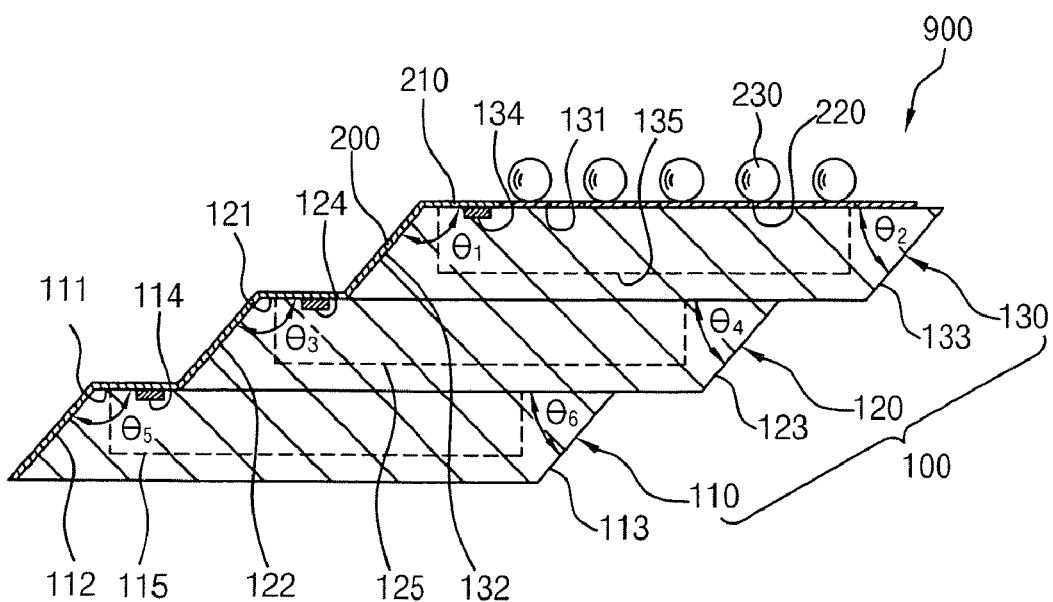
FIG. 3 is a cross-sectional view showing a stacked semiconductor package in accordance with a second embodiment of the present invention.

FIG. 3 is a cross-sectional view showing a stacked semiconductor package in accordance with a second embodiment of the present invention. The stacked semiconductor package according to this second embodiment of the present invention is substantially the same as that shown in FIGS. 1 and 2, with the exception of the extension parts 210, ball land parts 220, and connection members 230 additionally included in the embodiment shown in FIG. 3. Therefore, the same technical terms and reference numerals will be used to refer to the substantially same component parts, and detailed descriptions thereof will be omitted.

Referring to FIG. 3, a stacked semiconductor package 900 includes a semiconductor chip module 100, and connection patterns 200 that include extension parts 210, ball land parts 220, and connection members 230.

The semiconductor chip module 100 includes first through third semiconductor chips 110, 120, and 130, which are stacked to be staggered in the shape of steps. The first through third semiconductor chips 110, 120, and 130 respectively include pads 114, 124, and 134 that are exposed to the outside. The connection patterns 200 formed in the shape of lines connect the pads 114, 124 and 134 of the first through third semiconductor chips 110, 120 and 130. In the present embodiment, the connection patterns 200 include the extension parts 210, the ball land parts 220, and the connection members 230.

The extension parts 210 are connected to the first ends of the connection patterns 200 connected with the pads 134 on the upper surface 131 of the third semiconductor chip 130, which is placed uppermost in the semiconductor chip module 100, and extend toward the center portion of the upper surface 131.

The ball land parts 220 are branched from the extension parts 210. For example, the ball land parts 220 are located in accordance with the regulations of the Joint Electron Device Engineering Council (JEDEC).

The connection members 230 are connected to the respective ball land parts 220. For example, in the present embodiment, the connection members 230 may comprise conductive balls containing low melting point metal formed of a material such as solder.

In the present embodiment, the stacked semiconductor package 900, which has the extension parts 210, the ball land parts 220, and the connection members 230, can be directly mounted to a printed circuit board (not shown), or the like using the connection members 230.

Figure 4:
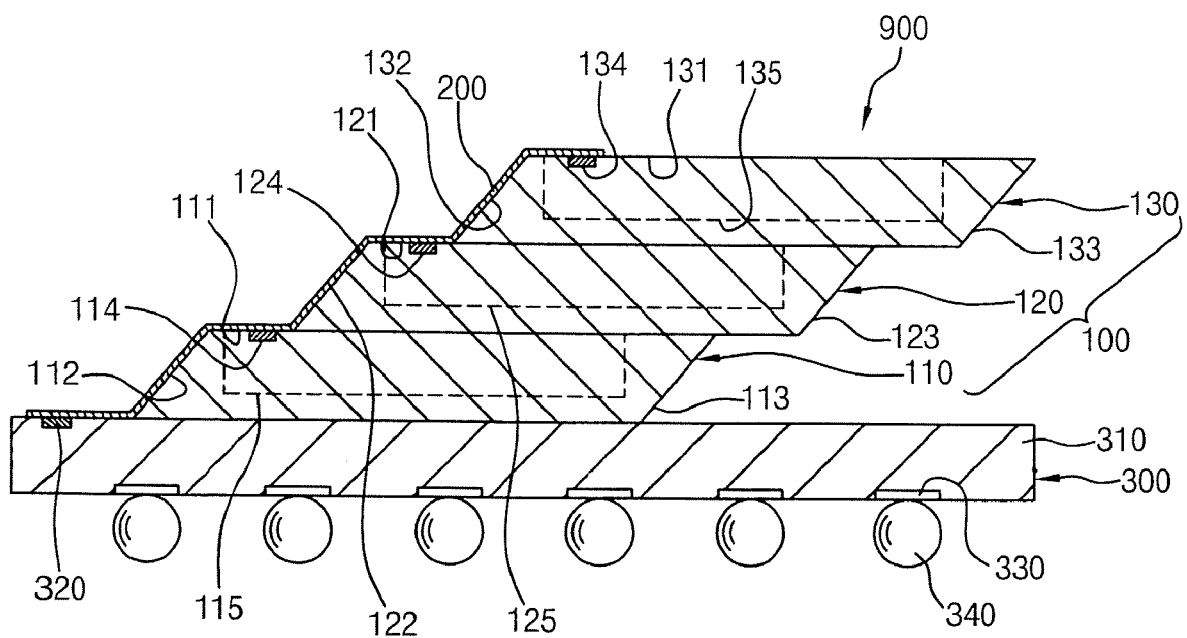
FIG. 4 is a cross-sectional view showing a stacked semiconductor package in accordance with a third embodiment of the present invention.

FIG. 4 is a cross-sectional view showing a stacked semiconductor package in accordance with a third embodiment of the present invention. The stacked semiconductor package according to this third embodiment of the present invention is substantially the same as that shown in FIGS. 1 and 2 with the exception of an additional substrate 300 shown in FIG. 4. Therefore, the same technical terms and reference numerals will be used to refer to the substantially same component parts, and detailed descriptions thereof will be omitted.

Referring to FIG. 4, a stacked semiconductor package 900 includes a semiconductor chip module 100, connection patterns 200, and a substrate 300.

The semiconductor chip module 100 includes first through third semiconductor chips 110, 120, and 130 which are stacked to be staggered in the shape of steps. The first through third semiconductor chips 110, 120, and 130 include pads 114, 124, and 134 respectively which are exposed to the outside.

The connection patterns 200 are formed in the shape of lines and connect respective pads 114, 124, and 134 of the first through third semiconductor chips 110, 120, and 130.

The substrate 300 includes a substrate body 310, connection pads 320, and ball land patterns 330. In addition, the substrate 300 may further include connection members 340.

In the present embodiment, for example, the substrate body 310 can comprise a printed circuit board (PCB). The lower surface of the first semiconductor chip 110 of the semiconductor chip module 100 is placed on the upper surface of the substrate body 310. In the present embodiment, the first semiconductor chip 110 can be attached to the substrate body 310, for example, by an adhesive member (not shown).

The connection pads 320 are disposed on the upper surface of the substrate body 310. The connection pads 320 are electrically connected with the connection patterns 200 that are formed on the first inclined side surface 112 of the first semiconductor chip 110. In the present embodiment, the connection patterns 200 are directly connected with the connection pads 320 without using connection members such as solders.

The ball land patterns 330 are disposed on the lower surface of the substrate body 310, which faces away from the upper surface, and are electrically connected with the connection pads 320. For example, in the present embodiment, the ball land patterns 330 are located in accordance with the regulations of JEDEC.

The connection members 340 can be disposed on and connected with the ball land patterns 330. The connection members 240 may comprise conductive balls containing low melting point metal formed of a material such as solder.

Figure 5:
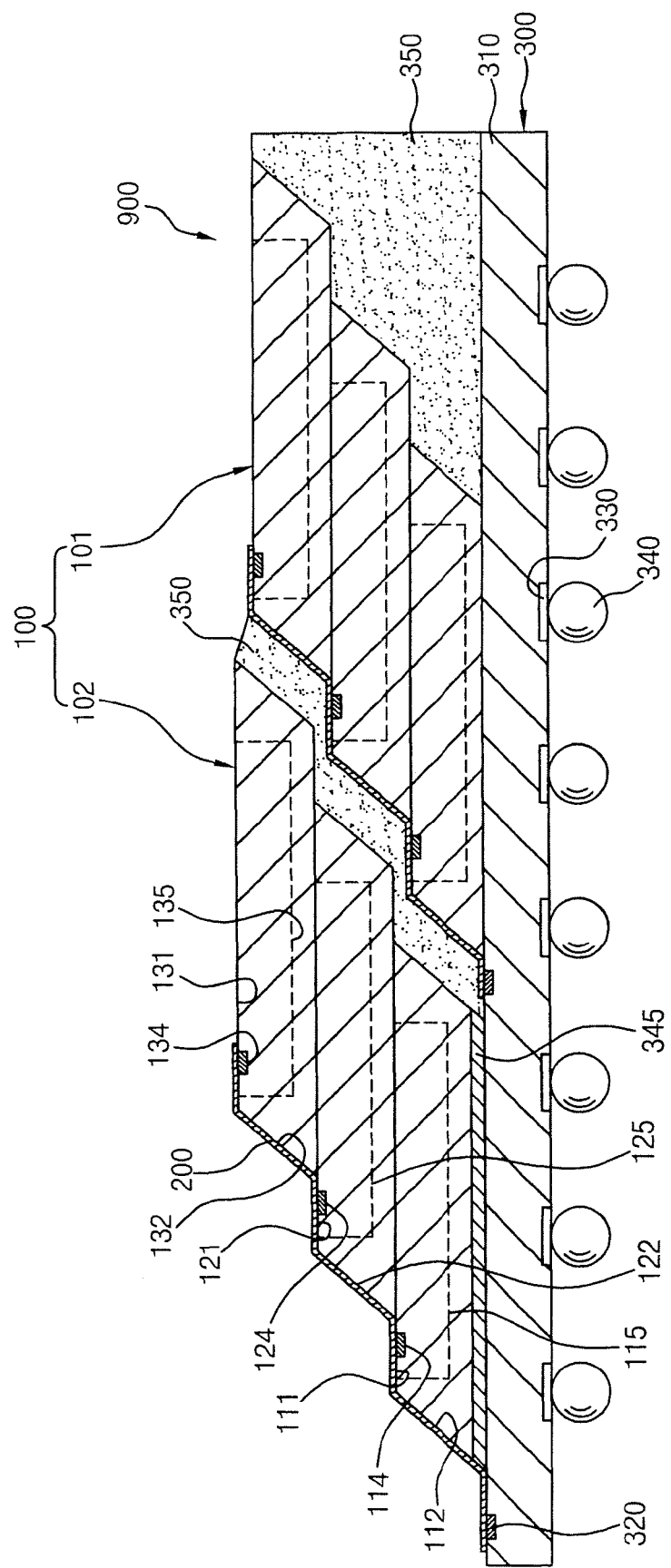
FIG. 5 is a cross-sectional view showing a stacked semiconductor package in accordance with a fourth embodiment of the present invention.

FIG. 5 is a cross-sectional view showing a stacked semiconductor package in accordance with a fourth embodiment of the present invention. The stacked semiconductor package according to this embodiment of the present invention is substantially the same as that shown in FIG. 4, except the embodiment as shown in FIG. 5 also includes a plurality of package modules and a gap fill member. Therefore, the same technical terms and reference numerals will be used to refer to the substantially same component parts, and detailed descriptions thereof will be omitted.

Referring to FIG. 5, a stacked semiconductor package 900 includes at least two semiconductor chip modules 100, connection patterns 200, a substrate 300, and a gap fill member 350.

In the present embodiment, each of the two or more semiconductor chip modules 100 include first through third semiconductor chips 110, 120, and 130 which are stacked to be staggered in the shape of steps. The connection patterns 200, which are formed in the shape of lines, electrically connect the respective pads 114, 124, and 134 of the first through third semiconductor chips 110, 120 and, 130 which are included in each semiconductor chip module 100.

The substrate 300 includes a substrate body 310, connection pads 320, and ball land patterns 330. In addition, the substrate 300 may further include connection members 340.

In the present embodiment, two or more semiconductor chip modules 100, which are disposed on the upper surface of the substrate 300, are defined as a first semiconductor chip module 101 and a second semiconductor chip module 102.

The two or more semiconductor chip modules are each positioned on the upper surface of the substrate such that a portion of the first semiconductor chip module 101 overlaps with a portion of the second semiconductor chip module 102. That is, the first inclined side surfaces 112, 122, and 132 of the first semiconductor chip module 101 are positioned to face the second inclined side surfaces 113, 123, and 133 of the second semiconductor chip module 102. In the present embodiment, a spacer 345 is interposed between the second semiconductor chip module 102 and the substrate 300, so the first inclined side surfaces 112, 122, and 132 of the first semiconductor chip module 101 and the second inclined side surfaces 113, 123, and 133 of the second semiconductor chip module 102 are separated from each other by a predetermined distance.

In the present embodiment, an increased number of semiconductor chip modules can be mounted on the substrate 300 having a fixed area because the fact that the first inclined side surface 112, 122, and 132 of the first semiconductor chip module 101 are positioned to face the second inclined side surfaces 113, 123, and 133 of the second semiconductor chip module 102.

The first and second semiconductor chip modules 101 and 102 can be damaged by shocks and/or vibrations applied from the outside because the presence of the spacer 345 creates a gap defined between the partially overlapping first and second semiconductor chip modules 101 and 102.

In the present embodiment, in order to prevent the first and second semiconductor chip modules 101 and 102, which partially overlap with each other, from being damaged, a gap fill member 350 is formed between the first and second semiconductor chip modules 101 and 102. The gap fill member 350 may include, for example, an epoxy resin material.

In the present embodiment, the gap fill member 350 is formed not only between the first and second semiconductor chip modules 101 and 102 but also between the first semiconductor chip module 101 and the substrate 300 on the side of the first semiconductor chip module 101 that does not overlap with the second semiconductor chip module 102.

Figure 6:
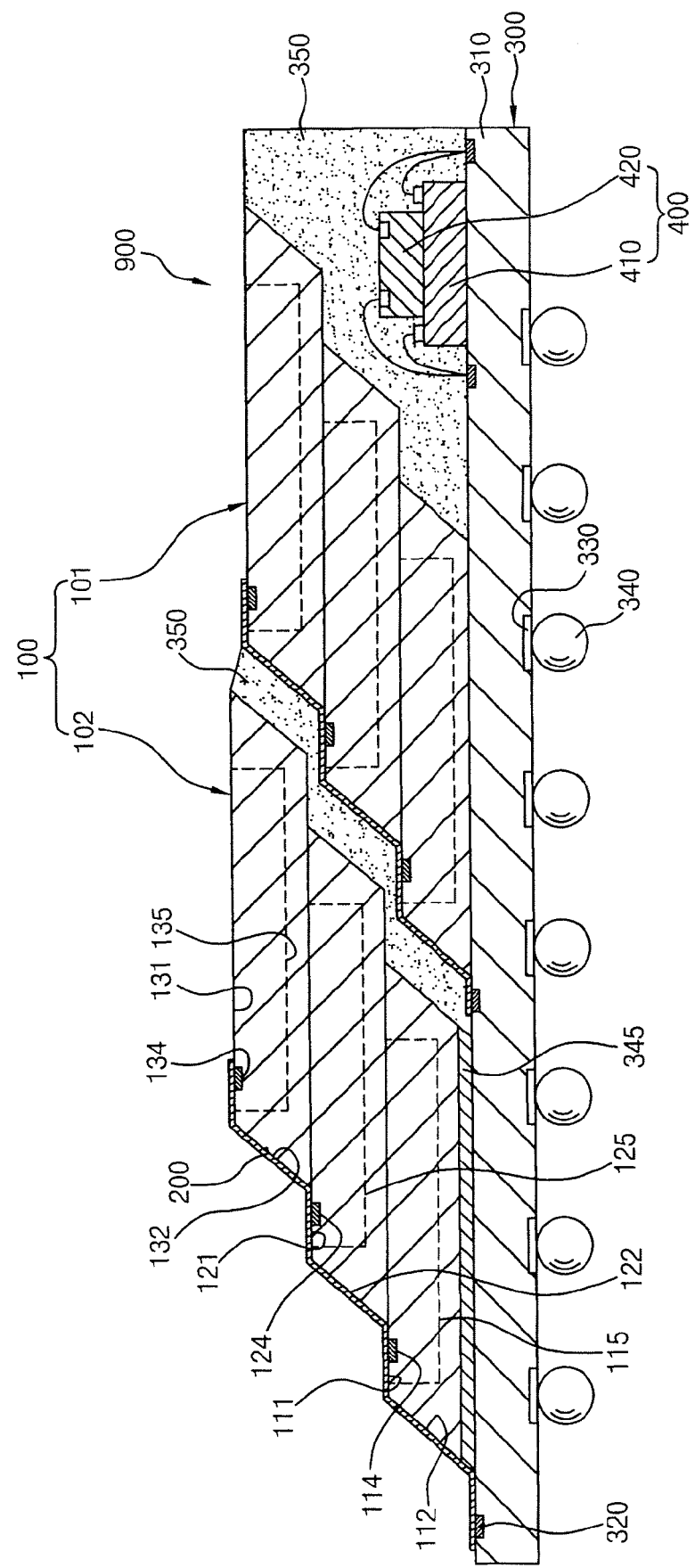
FIG. 6 is a cross-sectional view showing a stacked semiconductor package in accordance with a fifth embodiment of the present invention.

FIG. 6 is a cross-sectional view showing a stacked semiconductor package in accordance with a fifth embodiment of the present invention. The stacked semiconductor package according to this fifth embodiment of the present invention is substantially the same as that shown in FIG. 5 with the exception of an additional semiconductor package as shown in FIG. 6. Therefore, the same technical terms and reference numerals will be used to refer to the substantially same component parts, and detailed descriptions thereof will be omitted.

Referring to FIG. 6, a first semiconductor chip module 101 and a second semiconductor chip module 102 are disposed on a substrate 300. An additional package 400 is placed in the space defined between the first semiconductor chip module 101 and the substrate 300.

It is possible to increase the level of integration of semiconductor packages formed on the substrate 300, which has a fixed area, because the additional semiconductor package 400 is placed in the space defined between the first semiconductor chip module 101 and the substrate 300.

In the present embodiment, the additional semiconductor package 400 may comprise a stacked semiconductor package composed of a plurality of semiconductor chips 410 and 420. The additional semiconductor package 400 is electrically connected to connection pads formed on the substrate 300.

In the present embodiment, the additional semiconductor package 400 may comprise a system semiconductor package for processing data and the first and second semiconductor chip modules 101 and 102 may comprise memory semiconductor packages for storing data. Alternatively, the additional semiconductor package 400 may comprise a memory semiconductor package for storing data and the first and second semiconductor chip modules 101 and 102 may comprise system semiconductor packages for processing data at a high speed.

Figure 7:
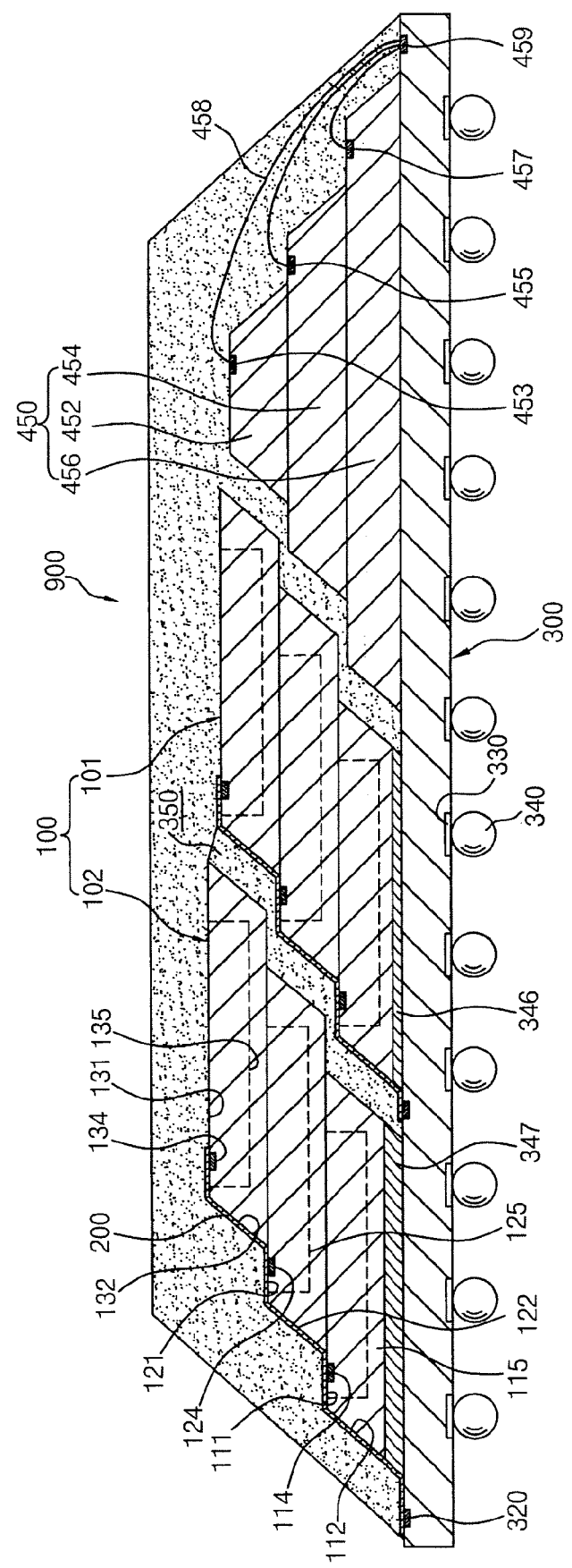
FIG. 7 is a cross-sectional view showing a stacked semiconductor package in accordance with a sixth embodiment of the present invention.

FIG. 7 is a cross-sectional view showing a stacked semiconductor package in accordance with a sixth embodiment of the present invention. The stacked semiconductor package according to this sixth embodiment of the present invention is substantially the same as that shown in FIG. 6, with the exception of an additional semiconductor package shown in FIG. 7. Therefore, the same technical terms and reference numerals will be used to refer to substantially the same component parts, and detailed descriptions thereof will be omitted.

Referring to FIG. 7, a stacked semiconductor package 900 includes a first semiconductor chip module 101, a second semiconductor chip module 102, a substrate 300, and an additional semiconductor package 450.

The first semiconductor chip module 101 is disposed on the upper surface of the substrate 300, and the second semiconductor chip module 102 is also disposed on the upper surface of the substrate 300 adjacent to the first semiconductor chip module 101. The first inclined side surfaces 112, 122, and 132 of the first semiconductor chip module 101 and the second inclined side surfaces 113, 123, and 133 of the second semiconductor chip module 102 face each other.

The additional semiconductor package 450 is disposed adjacent to the first semiconductor chip module 101. The additional semiconductor package 450 includes semiconductor chips 452, 454, and 456, which are formed to have the shape of trapezoids, possessing different sizes. The additional semiconductor package 450, which is formed by stacking the semiconductor chips 452, 454 and 456 each having the shape of a trapezoid, has, for example, the shape of a pyramid. That is, the semiconductor chip 456 having the shape of a trapezoid is disposed on the substrate 300, the semiconductor chip 454 having the shape of a smaller trapezoid is disposed on the semiconductor chip 456, and the semiconductor chip 452 having the shape of an even smaller trapezoid is disposed on the upper surface of the semiconductor chip 454, such that the semiconductor package 450 has the shape of a pyramid.

Bonding pads 453, 455, and 457, located on the semiconductor chips 452, 454, and 456 included in the additional semiconductor package 450, are electrically connected to connection pads 459 of the substrate 300 by conductive wires 458.

The inclined side surfaces of the additional semiconductor package 450 face the second inclined side surfaces 113, 123, and 133 of the first semiconductor chip module 101.

In the present embodiment, a spacer 346, having a first thickness, is formed between the first semiconductor chip module 101 and the substrate 300 defining a gap between the inclined side surface of the additional semiconductor package 450 and the second inclined side surfaces 113, 123, and 133 of the first semiconductor chip module 101.

Also, a spacer 347, having a second thickness greater than the first thickness, is formed between the second semiconductor chip module 102 and the substrate 300 defining a gap between the first inclined side surfaces 112, 122 and, 132 of the first semiconductor chip module 101 and the second inclined side surfaces 113, 123, and 133 of the second semiconductor chip module 102.

In the present embodiment, the additional semiconductor package 450 may comprise a system semiconductor package for processing data and the first and second semiconductor chip modules 101 and 102 may comprise memory semiconductor packages for storing data. Alternatively, the additional semiconductor package 400 may comprise a memory semiconductor package for storing data and the first and second semiconductor chip modules 101 and 102 may comprise system semiconductor packages for processing data at a high speed.

A gap fill member 350 is filled in the gap defined between the first semiconductor chip module 101 and the second semiconductor chip module 102 and the gap defined between the first semiconductor chip module 101 and the additional semiconductor package 450.

Figure 8:
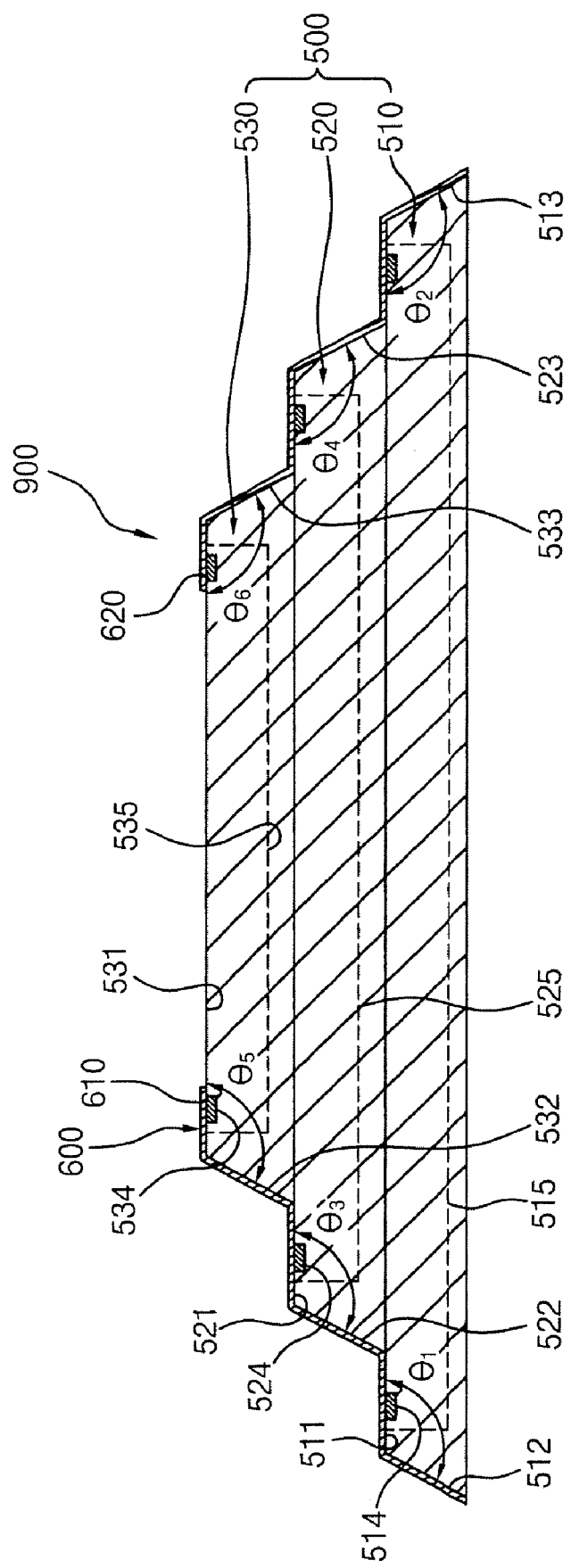
FIG. 8 is a cross-sectional view showing a stacked semiconductor package in accordance with a seventh embodiment of the present invention.

FIG. 8 is a cross-sectional view showing a stacked semiconductor package in accordance with a seventh embodiment of the present invention.

Referring to FIG. 8, a stacked semiconductor package 900 includes a semiconductor chip module 500 and connection patterns 600.

The semiconductor chip module 500 includes a plurality of semiconductor chips 510, 520, and 530. For example, in the present embodiment, the semiconductor chip module 500 includes three semiconductor chips 510, 520, and 530. Hereinbelow, the three semiconductor chips 510, 520, and 530 of the semiconductor chip module 500 are defined as a first semiconductor chip 510, a second semiconductor chip 520, and a third semiconductor chip 530.

For example, in the present embodiment, the first through third semiconductor chips 510, 520, and 530 may comprise the same kind of semiconductor chips, having the same shape (e.g., the shape of a trapezoid) and different sizes. Alternatively, the first through third semiconductor chips 510, 520, and 530 may comprise different kinds of semiconductor chips, having the same shape and different sizes. For example, one of the first through third semiconductor chips 510, 520, and 530 may be a memory semiconductor chip for storing data, and the remaining semiconductor chips may be system semiconductor chips for processing data.

The first semiconductor chip 510 can include an upper surface 511 and at least one inclined side surface 512, which connects with the upper surface 511. In the present embodiment, the first semiconductor chip 510 has an upper surface 511 and two inclined side surfaces 512 and 513 which connect with opposite edges of the upper surface 511. Hereafter, the two inclined side surfaces 512 and 513 are respectively defined as a first inclined side surface 512 and a second inclined side surface 513.

Both the angle $\theta_1$ between the first inclined side surface 512 and the upper surface 511 and the angle $\theta_2$ between the second inclined side surface 513 and the upper surface 511 are set as obtuse angles. In the present embodiment, the angle $\theta_1$ defined by the first inclined side surface 512 and the upper surface 511 and the angle $\theta_2$ defined by the second inclined side surface 513 and the upper surface 511 are equal to each other. Accordingly, the first semiconductor chip 510 having the first and second inclined side surfaces 512 and 513 has a trapezoidal shape. In the present embodiment, the first semiconductor chip 510 having the trapezoidal shape has a first size.

Pads 514 are located on the upper surface 511 of the first semiconductor chip 510. In the present embodiment, a plurality of pads 514 are located along both edges of the upper surface 511 adjacent to the first and second inclined side surfaces 512 and 513. The pads 514 are electrically connected with a circuit section 515 of the first semiconductor chip 510.

In the present embodiment, in the event that the pads 514 are located centrally on the upper surface 511 of the first semiconductor chip 510, the pads 514 are electrically connected to first ends of re-distribution lines (not shown), and second ends of the re-distribution lines, which face away from the first ends, extend to both edges of the upper surface 511, which are connected with the first and second inclined side surfaces 512 and 513 of the of the first semiconductor chip 510.

The second semiconductor chip 520 is placed on the upper surface of the first semiconductor chip 510 such that the pads 514 of the first semiconductor chip 510 are exposed from the second semiconductor chip 520. In the present embodiment, the second semiconductor chip 520 has a second size less than the first size of the first semiconductor chip 510, and the pads 514 of the first semiconductor chip 510 are exposed from the second semiconductor chip 520.

The second semiconductor chip 520 can have an upper surface 521 and at least one inclined side surface 522 that is connected with the upper surface 521. In the present embodiment, the second semiconductor chip 520 has an upper surface 521 and two inclined side surfaces 522 and 523, which connect with opposite edges of the upper surface 521. Hereafter, the two inclined side surfaces 522 and 523 are respectively defined as a first inclined side surface 522 and a second inclined side surface 523.

The angle $\theta_3$ between the first inclined side surface 522 and the upper surface 521 and the angle $\theta_4$ between the second inclined side surface 523 and the upper surface 521 are set as obtuse angles. Accordingly, the second semiconductor chip 520 having the first and second inclined side surfaces 522 and 523 has a trapezoidal shape.

Pads 524 are located on the upper surface 521 of the second semiconductor chip 520. In the present embodiment, a plurality of pads 524 are located along both edges of the upper surface 521 adjacent to the first and second inclined side surfaces 522 and 523. The pads 524 are electrically connected with a circuit section 525 of the second semiconductor chip 520.

In the present embodiment, in the event that the pads 524 are located centrally on the upper surface 521 of the second semiconductor chip 520, the pads 524 are electrically connected with first ends of re-distribution lines (not shown), and second ends of the re-distribution lines, which face away from the first ends, extend to both edges of the upper surface 521, which are connected with the first and second inclined side surfaces 522 and 523 of the of the second semiconductor chip 520.

The third semiconductor chip 530 is placed on the upper surface 521 of the second semiconductor chip 520. The third semiconductor chip 530 has a third size, which is less than the second size of the second semiconductor chip 520, and therefore, the pads 524 of the second semiconductor chip 520 are exposed from the third semiconductor chip 530.

The third semiconductor chip 530 can include an upper surface 531 and at least one inclined side surface 532 that connects with the upper surface 531. In the present embodiment, the third semiconductor chip 530 has an upper surface 531 and two inclined side surfaces 532 and 533, which connect with opposite edges of the upper surface 531. Hereafter, the two inclined side surfaces 532 and 533 are respectively defined as a first inclined side surface 532 and a second inclined side surface 533.

The angle $\theta_5$ between the first inclined side surface 532 and the upper surface 531 and the angle $\theta_6$ between the second inclined side surface 533 and the upper surface 531 are set as obtuse angles. In the present embodiment, the third semiconductor chip 530 having the first and second inclined side surfaces 532 and 533 has a trapezoidal shape.

Pads 534 are located on the upper surface 531 of the third semiconductor chip 530. In the present embodiment, a plurality of pads 534 are located along both edges of the upper surface 531 adjacent to the first and second inclined side surfaces 532 and 533. The pads 534 are electrically connected with a circuit section 535 of the third semiconductor chip 530.

In the present embodiment, in the event that the pads 534 are located centrally on the upper surface 531 of the third semiconductor chip 530, the pads 534 are electrically connected with first ends of re-distribution lines (not shown), and second ends of the re-distribution lines, which face away from the first ends, extend to both edges of the upper surface 531, which are connected with the first and second inclined side surfaces 532 and 533 of the of the third semiconductor chip 530.

The connection patterns 600 include a first connection patterns 610 which connect respective pads 514, 524, and 534 along the first inclined side surfaces 512, 522, and 532 of the first through third semiconductor chips 510, 520, and 530 placed in a staggered pattern having the shape of steps, and second connection patterns 620 which connect respective pads 514, 524, and 534 along the second inclined side surfaces 513, 523, and 533 of the first through third semiconductor chips 510, 520, and 530.

When viewed from the top, the connection patterns 600 have the shape of lines. The connection patterns 600 may comprise a plated layer, conductive patterns formed by patterning a conductive layer, a conductive film, or the like.

Figure 9:
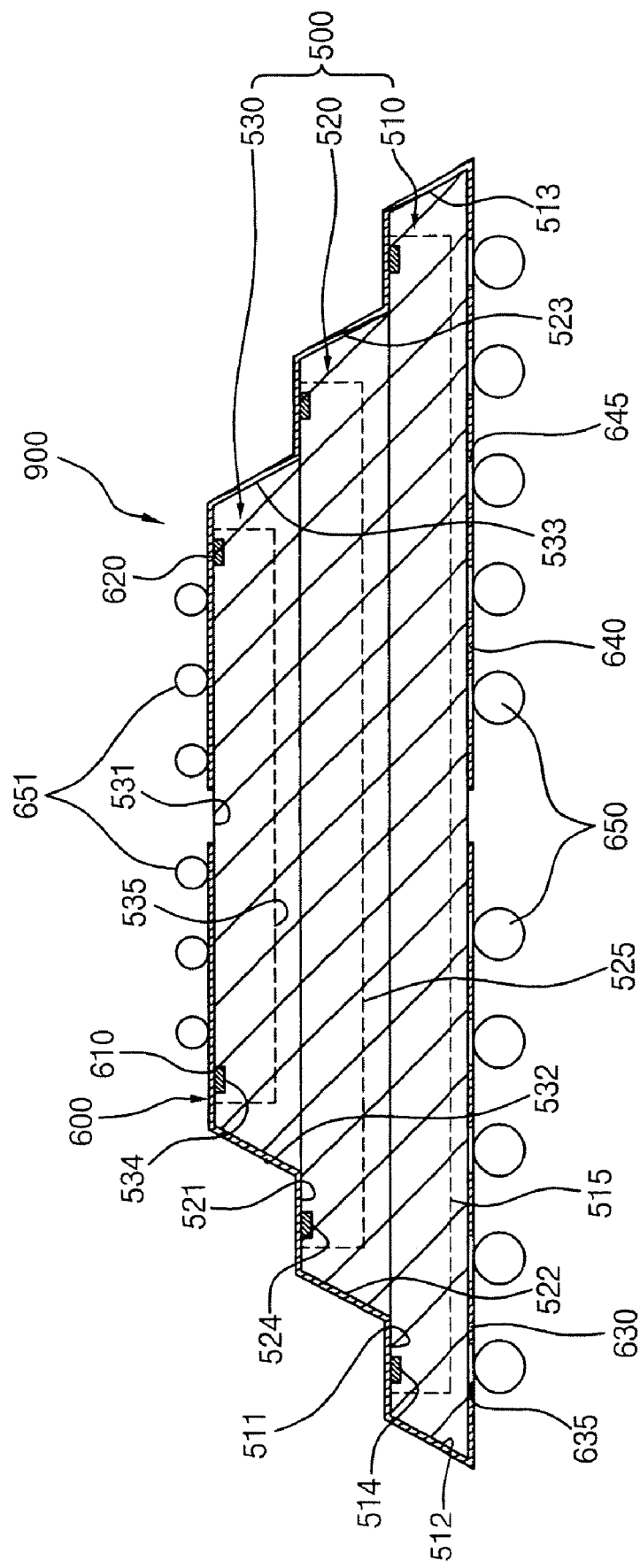
FIG. 9 is a cross-sectional view showing a stacked semiconductor package in accordance with an eighth embodiment of the present invention.

FIG. 9 is a cross-sectional view showing a stacked semiconductor package in accordance with an eighth embodiment of the present invention. The stacked semiconductor package according to this eighth embodiment of the present invention is substantially the same as that shown in FIG. 8, with the exception of the extension parts, ball land parts, and connection members shown in FIG. 9. Therefore, the same technical terms and reference numerals will be used to refer to the substantially same component parts, and detailed descriptions thereof will be omitted.

Referring to FIG. 9, a stacked semiconductor package 900 includes a semiconductor chip module 500 and connection patterns 600. The connection patterns 600 have extension parts 630 and 640 and ball land parts 635 and 645.

The first through third semiconductor chips 510, 520, and 530 are placed in a staggered pattern having the shape of steps. The first ends of the connection patterns 610 connect respective pads 514, 524, and 534 along the first inclined side surfaces 512, 522, and 532 of the first through third semiconductor chips 510, 520 and 530 and include the extension parts 630, which extend along the lower surface of the first semiconductor chip 510, and the ball land parts 635, which are branched from the extension parts 630.

The first ends of the connection patterns 620 connect respective pads 514, 524, and 534 along the second inclined side surfaces 513, 523, and 533 of the first through third semiconductor chips 510, 520, and 530 and include the extension parts 640, which extend along the lower surface of the first semiconductor chip 510, and the ball land parts 645, which are branched from the extension parts 640.

Connection members 650 containing low melting point metal such as solders are located on the ball land parts 635, which are branched from the extension parts 630 extending from the first connection patterns 610, and on the ball land parts 645, which are branched from the extension parts 640 extending from the second connection patterns 620.

The first and second connection patterns 610 and 620 may extend along the upper surface 531 of the third semiconductor chip 530, and connection members 651 may be located on the first and second connection patterns 610 and 620 which extend along the upper surface 531 of the third semiconductor chip 530.

Figure 10:
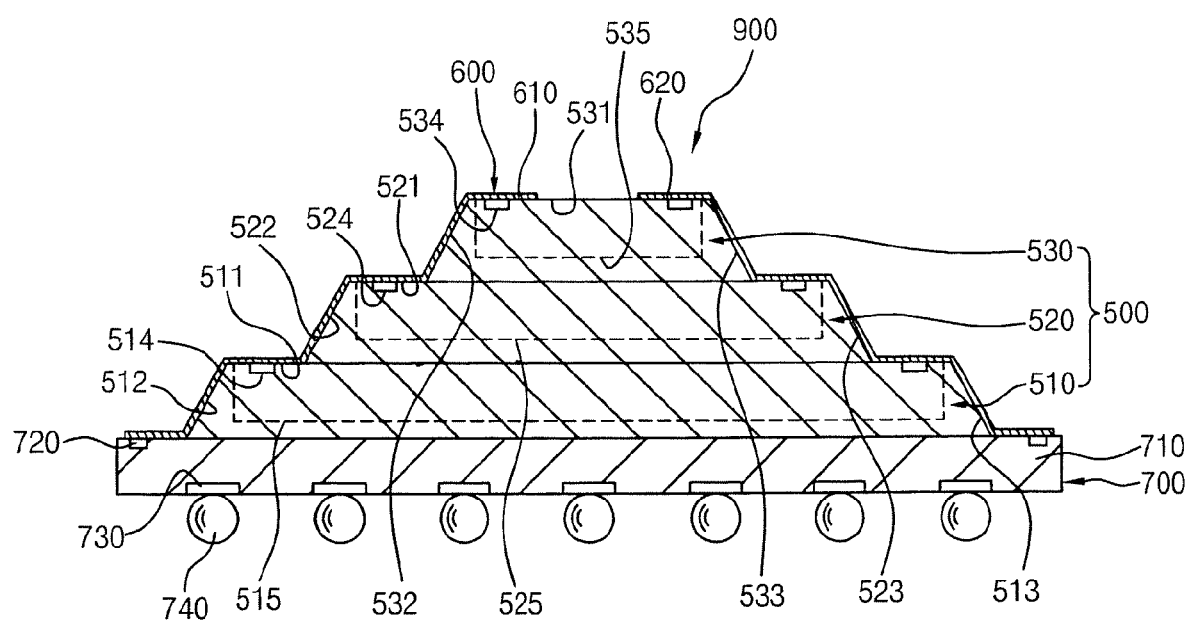
FIG. 10 is a cross-sectional view showing a stacked semiconductor package in accordance with a ninth embodiment of the present invention.

FIG. 10 is a cross-sectional view showing a stacked semiconductor package in accordance with a ninth embodiment of the present invention. The stacked semiconductor package according to this ninth embodiment of the present invention is substantially the same as that shown in FIG. 8, with the exception of an additional substrate as shown in FIG. 10. Therefore, the same technical terms and reference numerals will be used to refer to substantially the same component parts, and detailed descriptions thereof will be omitted.

Referring to FIG. 10, a stacked semiconductor package 900 includes a semiconductor chip module 500, connection patterns 600, and a substrate 700.

The semiconductor chip module 500 has first through third semiconductor chips 510, 520, and 530, which are placed in the shape of a pyramid, and pads 514, 524, and 534, which are located along both edges of upper surfaces 511, 521, and 531 of the first through third semiconductor chips 510, 520 and 530. That is, each of the first through third semiconductor chips 510, 520, 530 has the shape of a trapezoid and the size of each semiconductor chip 510, 520, 530 is sequentially decreased such that the uppermost semiconductor chip 530 is the smallest semiconductor chip.

The connection patterns 600 are electrically connected to respective pads 514, 524, and 534.

The substrate 700 has a substrate body 710, connection pads 720, ball land patterns 730, and connection members 740.

The substrate body 710 may comprise, for example, a printed circuit board.

The connection pads 720 are disposed on the upper surface of the substrate body 710 and are electrically connected to the connection patterns 600 of the semiconductor chip module 500.

The ball land patterns 730 are located on the lower surface of the substrate body 710 which faces away from the upper surface. The respective ball land patterns 730 are electrically connected to the connection pads 720 through conductive vias (not shown), or the like, which are formed in the substrate body 710.

The connection members 740 comprise conductive balls containing a low melting point metal such as solders. The connection members 740 are connected to the respective ball land patterns 730.

Figure 11:
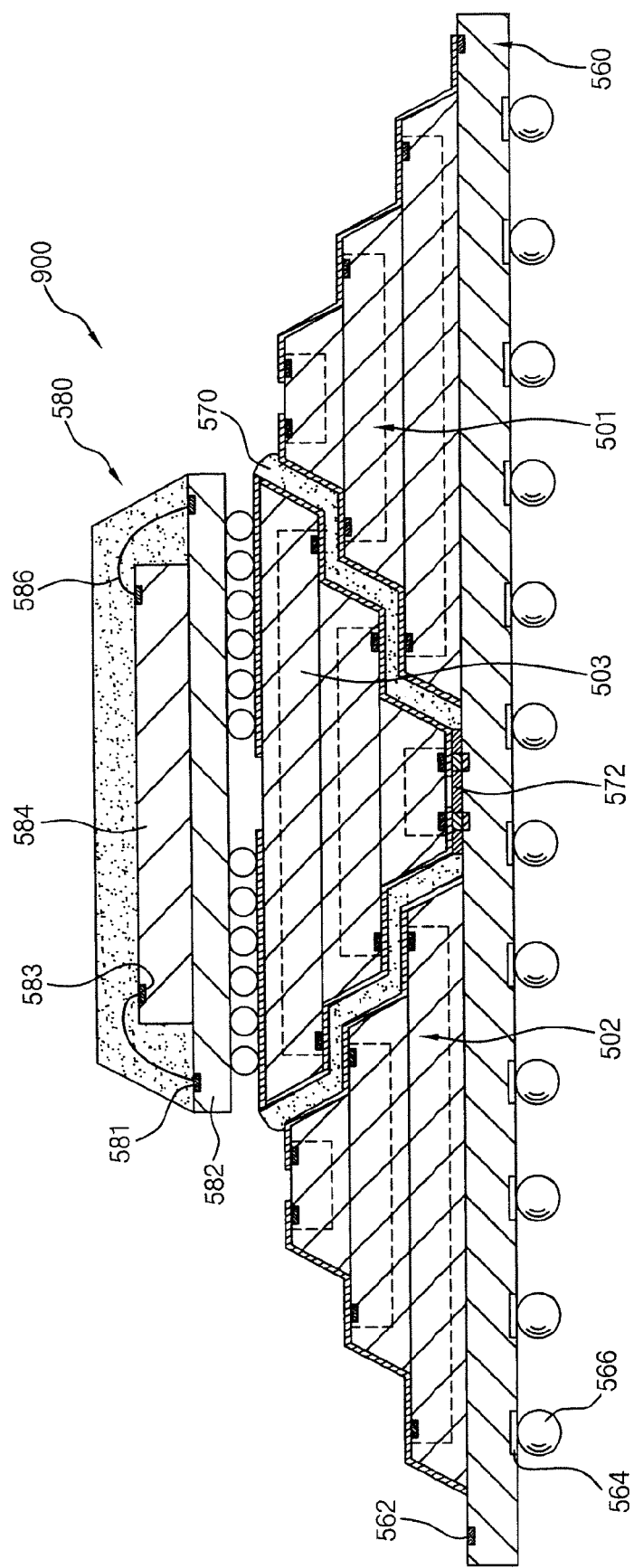
FIG. 11 is a cross-sectional view showing a stacked semiconductor package in accordance with a tenth embodiment of the present invention.

FIG. 11 is a cross-sectional view showing a stacked semiconductor package in accordance with a tenth embodiment of the present invention. The first through third semiconductor package modules included in the stacked semiconductor package according to this tenth embodiment of the present invention are substantially the same as the stacked semiconductor package shown in FIG. 8. Therefore, the same technical terms and reference numerals will be used to refer to the substantially same component parts, and detailed descriptions thereof will be omitted.

Referring to FIG. 11, a stacked semiconductor package 900 includes a substrate 560, a first stacked semiconductor package 501, a second stacked semiconductor package 502, a third stacked semiconductor package 503, a gap fill member 570, and an additional semiconductor package 580.

The substrate 560 may, for example, be a printed circuit board. A plurality of connection pads 562 are located on the upper surface of the substrate 560, and ball land patterns 564, which are electrically connected with the connection pads 562, are located on the lower surface of the substrate 560 which faces away from the upper surface. Connection members 566 are located on the ball land patterns 564.

The first stacked semiconductor package 501 and the second stacked semiconductor package 502 are placed on the upper surface of the substrate 560 in the shape of pyramids, and the third stacked semiconductor package 503 is placed on the substrate 560 between the first and second stacked semiconductor packages 501 and 502 in the shape of an inverted pyramid. That is, as shown in FIG. 11, the first and second stacked semiconductor packages become more narrow as they extend from the upper surface of the substrate 560, and the third stacked semiconductor package 503 becomes wider as it extends away from the upper surface of the substrate 560.

In the present embodiment, the upper surfaces and the inclined side surfaces of the semiconductor chips included in the first and second stacked semiconductor packages 501 and 502 face the upper surfaces and the inclined side surfaces of the semiconductor chips included in the third stacked semiconductor package 503. That is, the third stacked semiconductor package 503 is inverted in relation to the first and second stacked semiconductor packages 501 and 502.

A spacer 572 having a predetermined thickness is interposed between the third stacked semiconductor package 503 and the substrate 560. As shown in FIG. 11, the spacer 572 defines gaps between the first and third stacked semiconductor packages 501 and 503 and between the second and third stacked semiconductor packages 502 and 503.

Meanwhile, a gap fill member 570 is filled in the gaps defined between the first and third stacked semiconductor packages 501 and 503 and between the second and third stacked semiconductor packages 502 and 503. The gap fill member 570 prevents the first through third stacked semiconductor packages 501, 502, and 503 from being damaged by shocks and vibrations applied from the outside. In the present embodiment the gap fill member 570 may include a material such as epoxy resin.

The additional semiconductor package 580 is placed on the third stacked semiconductor package 503, which is placed on the substrate 560 in the shape of an inverted pyramid. The additional semiconductor package 580 is electrically connected with the third stacked semiconductor package 503.

The additional semiconductor package 580, for example, includes a printed circuit board 582, which includes connection pads 581, a semiconductor chip 584, which is placed on the printed circuit board 582 and includes bonding pads 583, and conductive wires 586, which electrically connect the bonding pads 583 and the connection pads 581 with each other.

In the present embodiment, for example, the first through third stacked semiconductor packages 501, 502, and 503 may comprise memory semiconductor packages for storing data, and the additional semiconductor package 580 may comprise a system semiconductor package for processing data. Alternatively, the first through third stacked semiconductor packages 501, 502, and 503 may comprise system semiconductor packages for processing data, and the additional semiconductor package 580 may comprise a memory semiconductor package for storing data.

Methods for manufacturing the stacked semiconductor packages according to the embodiments of the present invention will be described below.

Figure 12:
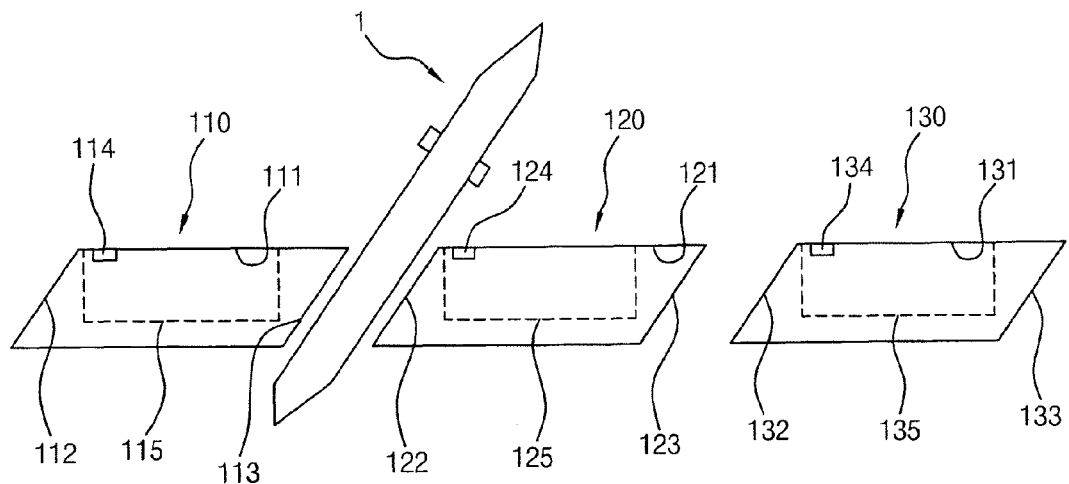
FIG. 12 is a cross-sectional view showing how individual semiconductor chips are cut from a wafer in the shape of parallelograms in order to manufacture a stacked semiconductor package according to an embodiment the present invention.

Referring to FIG. 12, in order to manufacture a stacked semiconductor package, a plurality of semiconductor chips 110, 120, and 130, which are formed on a wafer and have respective pads 114, 124, and 134, are individualized from the wafer by a sawing apparatus having a rotation blade 1.

Herebelow, the plurality of semiconductor chips 110, 120, and 130 are separated from the wafer and defined as a first semiconductor chip 110, a second semiconductor chip 120, and a third semiconductor chip 130.

When individualizing or separating the first through third semiconductor chips 110, 120, and 130 using the sawing apparatus, the rotation blade 1 cuts the first through third semiconductor chips 110, 120, and 130 while being obliquely positioned by an acute angle with respect to the upper surfaces of the first through third semiconductor chips 110, 120, and 130. As a result, first inclined side surfaces 112, 122, and 132, which define obtuse angles with respect to upper surfaces 111, 121, and 131 of the first through third semiconductor chips 110, 120, and 130, and second inclined side surfaces 113, 123, and 133, which define acute angles with respect to the upper surfaces 111, 121, and 131 of the first through third semiconductor chips 110, 120, and 130, are formed in the first through third semiconductor chips 110, 120, and 130.

The first through third semiconductor chips 110, 120, and 130, which are individualized by the sawing apparatus, have the shapes similar to a parallelogram. For example, with reference to the first semiconductor chip 110, the first and second inclined side surfaces 112 and 113 are parallel to each other and the upper surface 111 is parallel to the surface opposite the upper surface 111.

In the present embodiment, the first inclined side surfaces 112, 122, and 132 and the second inclined side surfaces 113, 123, and 133 face away from each other and, for example, are parallel to each other.

The first through third semiconductor chips 110, 120, and 130, which are cut from the wafer by the rotation blade 1 of the sawing apparatus, are stacked in a staggered pattern in the shape of steps, as a result, a semiconductor chip module 100 as shown in FIG. 2 is manufactured.

In detail, the second semiconductor chip 120 is placed on the upper surface 111 of the first semiconductor chip 110, and the third semiconductor chip 130 is placed on the upper surface 121 of the second semiconductor chip 120, by which the semiconductor chip module 100 is manufactured. In the present embodiment, an adhesive member (not shown) is applied between the first and second semiconductor chips 110 and 120 and between the second and third semiconductor chips 120 and 130, the first through third semiconductor chips 110, 120, and 130 are attached to one another.

The first through third semiconductor chips 110, 120, and 130 of the semiconductor chip module 100 are placed in a staggered pattern in the shape of steps, such that pads 114 of the first semiconductor chip 110, pads 124 of the second semiconductor chip 120, and pads 134 of the third semiconductor chip 130 are all exposed to the outside.

After the semiconductor chip module 100 is formed, respective pads 114, 124, and 134 of the first through third semiconductor chips 110, 120, and 130 of the semiconductor chip module 100 are electrically connected by conductive connection patterns 200 having the shape of lines formed on the first inclined side surfaces 112, 122, and 132 and upper surfaces 111, 121, and 131 as shown in FIG. 1, whereby a stacked semiconductor package 900 is manufactured.

In the present embodiment, in order to electrically connect respective pads 114, 124, and 134 of the first through third semiconductor chips 110, 120, and 130, connection patterns 200 can be formed through a plating process or an etching process for etching a conductive film. Alternatively, the connection patterns 200 can comprise conductive adhesive tapes having the shape of lines.

Referring to FIG. 3, in the step of forming the connection patterns 200, the first ends of the connection patterns 200 extend from the first inclined side surface 112 to an edge of the upper surface 131 of the third semiconductor chip 130 connected to the first inclined side surface 132. Extension parts 210, which are connected with the connection patterns 200, and ball land parts 220, which are branched from the extension parts 210, can be formed on the upper surface 131 of the third semiconductor chip 130.

The extension parts 210 are formed integrally with both the connection patterns 200 and the ball land parts 220, and can be formed through a plating process or an etching process for etching a conductive film. Alternatively, the extension parts 210 and the ball land parts 220 can comprise conductive adhesive tapes having the shape of lines.

Referring to FIG. 4, before forming the connection patterns 200 on the semiconductor chip module 100, the semiconductor chip module 100 is attached to a substrate 300 that includes a substrate body 310 having connection pads 320 formed on the upper surface thereof.

After the semiconductor chip module 100 is attached to the substrate 300, the connection patterns 200 for connecting respective pads 114, 124, and 134 of the first through third semiconductor chips 110, 120, and 130 of the semiconductor chip module 100 and the connection pads 320 with each other are formed.

Then, connection members 340 are attached to ball land patterns 330, which are located on the lower surface of the substrate 300 and are electrically connected with the connection pads 320, thus completing the manufacture of the stacked semiconductor package 900.

Although the connection patterns 200 have been illustrated and described in the present embodiment as being formed after attaching the semiconductor chip module 100 to the substrate 300, alternatively, the connection patterns 200 can be formed on the semiconductor chip module 100, and then the semiconductor chip module 100 having the connection patterns 200 formed thereon can be attached to the substrate 300.

Referring to FIG. 5, when attaching the semiconductor chip module 100 to the substrate 300, two or more semiconductor chip modules 100 can be attached to the substrate 300. In the present embodiment, for example, as shown in FIG. 5, two semiconductor chip modules 100 are attached to the substrate 300. The semiconductor chip modules 100 are defined as a first semiconductor chip module 101 and a second semiconductor chip module 102 respectively.

Herein after FIG. 5 will be described with in more detail. After the first semiconductor chip module 101 is attached to the substrate 300, the second semiconductor chip module 102 is attached to the substrate 300. At this time, the second inclined side surfaces 113, 123, and 133 of the second semiconductor chip module 102 face the first inclined side surfaces 112, 122, and 132 of the first semiconductor chip module 101. In the present embodiment, the connection patterns 200 of the first and second semiconductor chip modules 101 and 102 can be formed before the first and second semiconductor chip modules 101 and 102 are attached to the substrate 300.

After the first and second semiconductor chip modules 101 and 102 are attached to the substrate 300, a gap fill member 350 is filled both in the gap defined between the first and second semiconductor chip modules 101 and 102 and the gap defined between the first semiconductor chip module 101 and the substrate 300. The gap fill member 350 prevents the first and second semiconductor chip modules 101 and 102 from being damaged by shocks and vibrations applied from the outside of the package.

Then, solder balls 340 can be connected to ball land patterns 330 formed on the lower surface of the substrate 300.

Referring to FIG. 6, before filling the gap fill member 350, an additional semiconductor package 400, which is electrically connected with the substrate 300 by conductive wires, is placed in the space between the first semiconductor chip module 101 and the substrate 300. The gap fill member 350 is then filled in the gap defined between the first and second semiconductor chip modules 101 and 102 and the gap defined between the first semiconductor chip module 101 and the substrate 300.

Referring to FIG. 7, before filling the gap fill member 350, an additional semiconductor package 450 having the shape of a pyramid is placed in the space between the first semiconductor chip module 101 and the substrate 300. That is, the semiconductor chips of the additional semiconductor package are placed on the upper surface of the substrate such that the size of the semiconductor chips decreases as the distance from the substrate 300 increases. Then, the gap fill member 350 is filled in the gap defined between the first and second semiconductor chip modules 101 and 102 and the gap defined between the first semiconductor chip module 101 and the additional semiconductor package 450.

Figure 13:
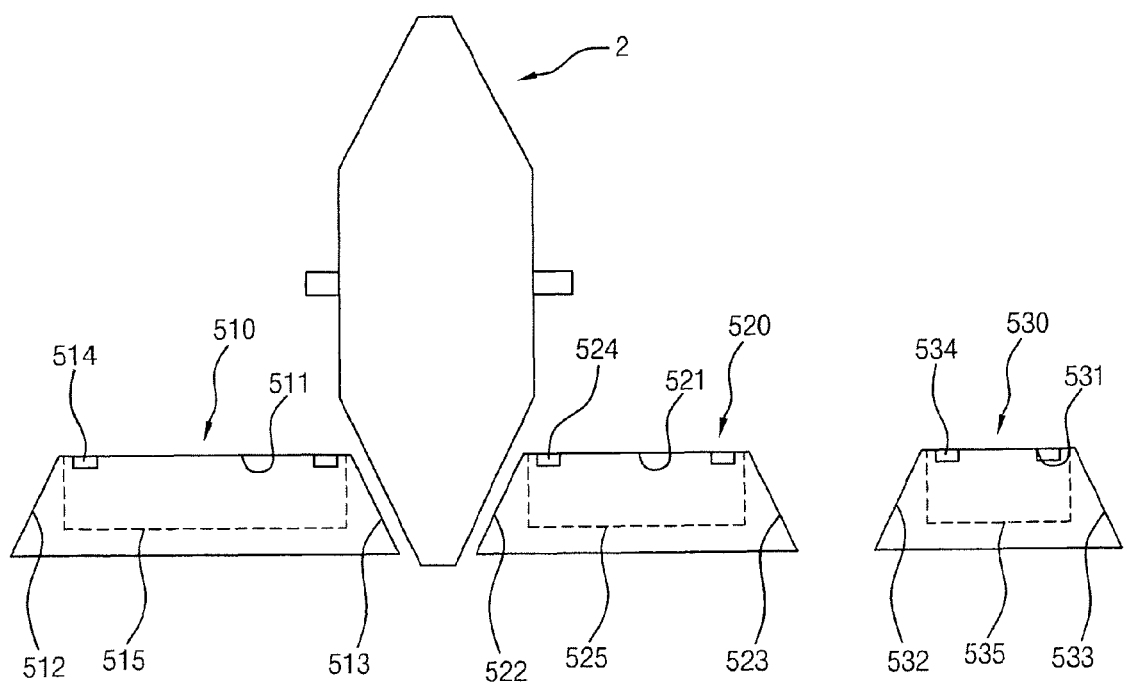
FIG. 13 is a cross-sectional view showing how individual semiconductor chips are cut from a wafer in the shape of trapezoids in order to manufacture a stacked semiconductor package according to an embodiment the present invention.

Referring to FIG. 13, in order to manufacture a stacked semiconductor package having the shape of a pyramid, a plurality of semiconductor chips 510, 520, and 530, which are formed on a wafer and include respective pads 514, 524, and 534, are individualized by a sawing apparatus having a rotation blade 1.

Herebelow, the plurality of semiconductor chips 510, 520 and 530, which are separated from the wafer, are defined as a first semiconductor chip 510, a second semiconductor chip 520, and a third semiconductor chip 530.

First inclined side surfaces 512, 522, and 532 are formed on first edges of upper surfaces 511, 521, and 531 of the first through third semiconductor chips 510, 520, and 530 to define obtuse angles with respect to the upper surfaces 511, 521 and 531, by the rotation blade 1 of the sawing apparatus for individualizing the first through third semiconductor chips 510, 520, and 530 from the wafer. Similarly, the second inclined side surfaces 513, 523, and 533 are formed on second edges of the upper surfaces 511, 521, and 531 of the first through third semiconductor chips 510, 520, and 530 to define obtuse angles with respect to the upper surfaces 511, 521, and 531, by the rotation blade 1 of the sawing apparatus for individualizing the first through third semiconductor chips 510, 520 and 530 from the wafer.

The first through third semiconductor chips 510, 520, and 530 are individualized by the sawing apparatus and have a substantially trapezoidal shape. In the present embodiment, the first semiconductor chip 510 has a first size, the second semiconductor chip 520 has a second size less than the first size, and the third semiconductor chip 530 has a third size less than the second size.

In the present embodiment, the first inclined side surfaces 512, 522, and 532 and the second inclined side surfaces 513, 523 and 533 face away from each other. That is, the first inclined side surfaces 512, 522, and 532 and the second inclined side surfaces 513, 523, and 533 are connected with opposite edges of respective upper surfaces 511, 521, and 531.

The first through third semiconductor chips 510, 520, and 530, which are cut from the wafer by the rotation blade 1 of the sawing apparatus, are stacked in a staggered pattern in the shape of steps, such that a semiconductor chip module 500 as shown in FIG. 8 is manufactured.

In detail, the second semiconductor chip 520 is placed on the upper surface 511 of the first semiconductor chip 510, and the third semiconductor chip 530 is placed on the upper surface 521 of the second semiconductor chip 520, by which the semiconductor chip module 500 is manufactured.

In the present embodiment, an adhesive member (not shown) is applied between the first and second semiconductor chips 510 and 520 and between the second and third semiconductor chips 520 and 530, such that the first through third semiconductor chips 510, 520, and 530 are attached to one another.

The first through third semiconductor chips 510, 520, and 530 of the semiconductor chip module 500 are placed in the shape of a pyramid, and therefore pads 514 of the first semiconductor chip 510, pads 524 of the second semiconductor chip 520, and pads 534 of the third semiconductor chip 530 are all exposed to the outside.

After the semiconductor chip module 500 is formed, the pads 514, 524, and 534, which are located at first sides on the upper surfaces 511, 521, and 531 of the first through third semiconductor chips 510, 520, and 530 of the semiconductor chip module 500, are electrically connected by first conductive connection patterns 610 having the shape of lines formed on the first inclined side surfaces 512, 522, and 532 and respective upper surfaces 511, 521, and 531 as shown in FIG. 8, whereby a stacked semiconductor package 900 is manufactured.

Similarly, the pads 514, 524, and 534, which are located at second sides, opposite the first sides, on the upper surfaces 511, 521, and 531 of the first through third semiconductor chips 510, 520, and 530 of the semiconductor chip module 500, are electrically connected by second conductive connection patterns 620 having the shape of lines formed on the second inclined side surfaces 513, 523, and 533 and respective upper surfaces 511, 521, and 531 as shown in FIG. 8, whereby the stacked semiconductor package 900 is manufactured.

In the present embodiment, in order to electrically connect the pads 514, 524, and 534 of the first through third semiconductor chips 510, 520, and 530, connection patterns 600 including the first and second connection patterns 610 and 620 can be formed through a plating process or an etching process for etching a conductive film. Alternatively, the connection patterns 600 can comprise conductive adhesive tapes having the shape of lines.

Referring to FIG. 9, in the step of forming the first connection patterns 610, the first ends of the first connection patterns 610 extend from the first inclined side surface 512 of the first semiconductor chip 510 to the lower surface of the first semiconductor chip 510 which faces away from the upper surface 511, and extension parts 630, which are connected with the first connection patterns 610, and ball land parts 635, which are branched from the extension parts 630, can be formed on the lower surface of the first semiconductor chip 510.

The extension parts 630, which are integrally formed with the first connection patterns 610, and the ball land parts 635 can be formed through an etching process for etching a conductive film or a plating process. Alternatively, the extension parts 630 and the ball land parts 635 can comprise conductive adhesive tapes having the shape of lines.

In the step of forming the second connection patterns 620, the first ends of the second connection patterns 620 extend from the second inclined side surface 513 of the first semiconductor chip 510 to the lower surface of the first semiconductor chip 510 which faces away from the upper surface 511, and extension parts 640, which are connected with the second connection patterns 620, and ball land parts 645, which are branched from the extension parts 640, can be formed on the lower surface of the first semiconductor chip 510.

The extension parts 640, which are integrally formed with the second connection patterns 620, and the ball land parts 645 can be formed through an etching process for etching a conductive film or a plating process. Alternatively, the extension parts 640 and the ball land parts 645 can comprise conductive adhesive tapes having the shape of lines.

After the ball land parts 635 connected with the first connection patterns 610 and the ball land parts 645 connected with the second connection parts 620 are formed, connection members 650 are electrically connected to the ball land parts 635 and 645.

Referring to FIG. 10, before forming the connection patterns 600 on the semiconductor chip module 500, the semiconductor chip module 500 is attached to a substrate 700 having a substrate body 710, which has connection pads 720 formed thereon.

After the semiconductor chip module 500 is attached to the substrate 700, the connection patterns 600, including the first and second connection patterns 610 and 620, are formed for connecting respective pads 514, 524 and, 534 of the first through third semiconductor chips 510, 520, and 530 of the pyramid shaped semiconductor chip module 500 and with the connection pads 720.

Then, the manufacture of a stacked semiconductor package 900 is completed by attaching connection members 740 to ball land patterns 730, which are located on the lower surface of the substrate 700 and are electrically connected with the connection pads 720.

Although the connection patterns 600 have been illustrated and described in the present embodiment as being formed after attaching the semiconductor chip module 500 to the substrate 700, alternatively, the semiconductor chip module 500 having the connection patterns 600 formed thereon can be attached to the substrate 700 after forming the connection patterns 600 on the semiconductor chip module 500.

Referring to FIG. 11, when attaching the semiconductor chip module 500 to the substrate 700, three or more semiconductor chip modules 500 can be attached to the substrate 700. In the present embodiment, for example, three semiconductor chip modules 500 are attached to the substrate 700. Herebelow, the respective semiconductor chip modules 500 are defined as a first semiconductor chip module 501, a second semiconductor chip module 502, and a third semiconductor chip module 503. In the present embodiment, the first through third semiconductor chip modules 501, 502, and 503 have the shape of pyramids.

In detail, the first semiconductor chip module 501 and the second semiconductor chip module 502 are placed on the substrate in the shape of pyramids, and connection patterns 600 of the first and second semiconductor chip modules 501 and 502 are electrically connected to connection pads 562 of the substrate 700. That is, the semiconductor chips of the first and second semiconductor chip modules 501 and 502 are placed on the upper surface of the substrate such that the size of the semiconductor chips decreases as the distance from the substrate 500 increases.

The third semiconductor chip module 503 is placed on the substrate 700 in the shape of an inverted pyramid. That is, the third semiconductor chip module 503 is shaped like a pyramid as described above, and then inverted such that the third semiconductor chip module has the shape of an inverted pyramid. The third semiconductor chip module 503 is placed in the space defined between the first and second semiconductor chip modules 501 and 502. At this time, the inclined side surfaces of the first and second semiconductor chip modules 501 and 502 face the inclined side surfaces of the third semiconductor chip module 503, as shown in FIG. 11.

After the first through third semiconductor chip modules 501, 502, and 503 are attached to the substrate 700, a gap fill member 570 is filled in the gap defined between the first and third semiconductor chip modules 501 and 503 and the gap defined between the second and third semiconductor chip modules 502 and 503. The gap fill member 570 prevents the first through third semiconductor chip modules 501, 502 and 503 from being damaged by shocks and vibrations applied from the outside.

After the first through third semiconductor chip modules 501, 502, and 503 are placed on the substrate 700 in the shapes of pyramids and an inverted pyramid, an additional semiconductor package 580 is electrically connected to the upper surface (i.e., the surface of the third semiconductor package furthest from the substrate 700) of the third semiconductor chip module 503. With reference to the pyramid shaped chip module 500 of FIG. 9, the first and second connection patterns 610 and 620 of the third semiconductor chip module 503 have extension parts which extend to the lower surface of the first semiconductor chip 510 and ball land parts which are branched from the extension parts 610 and 620. The connection members of the additional semiconductor package 580 are electrically connected with the ball land parts.

In the present embodiment, the first through third semiconductor chip modules 501, 502, and 503 may, for example, comprise memory semiconductor packages for storing data, and the additional semiconductor package 580 may, for example, comprise a system semiconductor package for processing data. Alternatively, the first through third semiconductor chip modules 501, 502 and 503 may, for example, comprise system semiconductor packages for processing data, and the additional semiconductor package 580 may, for example, comprise a memory semiconductor package for storing data.

Then, by connecting solder balls 566 to ball land patterns 564 which are formed on the lower surface of the substrate 700, a stacked semiconductor package 900 can be manufactured.

As is apparent from the above description, according to the present invention, two or more semiconductor chips can be electrically connected in a stacked package without forming conductive wires or defining through-holes in the semiconductor chips, and therefore both the volume of a stacked semiconductor package and the number of manufacturing processes can be decreased and the semiconductor chips of the package are prevented from being damaged.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
   a semiconductor chip module comprising two or more semiconductor chips stacked in the shape of steps, each semiconductor chip comprising:
      a plurality of pads formed on an upper surface of the semiconductor chip; and
      an inclined side surface connected with the upper surface; and
   connection patterns formed in the shape of lines on the inclined side surfaces and upper surfaces of the semiconductor chips to electrically connect respective pads of the semiconductor chips,
   wherein the inclined side surface is a first inclined side surface and each semiconductor chip further comprises a second inclined side surface opposite the first inclined side surface,
   wherein an angle defined between the first inclined side surface and the upper surface is an obtuse angle, and an angle defined by the second inclined side surface and the upper surface is an acute angle.

2. The stacked semiconductor package according to claim 1, wherein the connection patterns comprise:
   extension parts extending on the upper surface of an uppermost semiconductor chip of the two or more semiconductor chips of the semiconductor chip module; and
   ball land parts formed on the extension parts.

3. The stacked semiconductor package according to claim 1, wherein the semiconductor chips comprise the same kind of semiconductor chips having the same size or different kinds of semiconductor chips having the same size.

4. The stacked semiconductor package according to claim 1, further comprising:
   a substrate comprising:

a substrate body on which the semiconductor chip module is placed; connection pads located on an upper surface of the substrate body and electrically connected to the connection patterns, respectively; and
ball land patterns located on a lower surface of the substrate body, opposite the upper surface.

5. The stacked semiconductor package according to claim 4, wherein the semiconductor chip module comprises:
a first semiconductor chip module disposed on the upper surface of the substrate body; and
a second semiconductor chip module disposed on the upper surface of the substrate body,
wherein the first and second semiconductor chip modules are disposed on the upper surface of the substrate body such that the second inclined side surfaces of the semiconductor chips of the first semiconductor chip module and the first inclined side surfaces of the semiconductor chips of the second semiconductor chip module face each other.

6. The stacked semiconductor package according to claim 5, further comprising:
an additional semiconductor package positioned in a space defined between the second semiconductor chip module and the substrate body.

7. A stacked semiconductor package comprising:
a semiconductor chip module comprising two or more semiconductor chips stacked in the shape of steps, each semiconductor chip comprising:
a plurality of pads formed on an upper surface of the semiconductor chip; and
an inclined side surface connected with the upper surface; and connection patterns formed in the shape of lines on the inclined side surfaces and upper surfaces of the semiconductor chips to electrically connect respective pads of the semiconductor chips,
wherein the inclined side surface is a first inclined side surface and each semiconductor chip further comprises a second inclined side surface opposite the first inclined side surface,
wherein an angle defined between the first inclined side surface and the upper surface is an obtuse angle, and an angle defined by the second inclined side surface and the upper surface is an obtuse angle.

8. The stacked semiconductor package according to claim 7, wherein the connection patterns comprise:
extension parts extending on a lower surface, opposite the upper surface, of the lowermost semiconductor chip of the two or more semiconductor chips of the semiconductor chip module; and
ball land parts formed on the extension parts.

9. The stacked semiconductor package according to claim 7, wherein the semiconductor chips comprise the same kind of semiconductor chips having different sizes or different kinds of semiconductor chips having different sizes.

10. The stacked semiconductor package according to claim 7, further comprising:
a substrate comprising:
a substrate body on which the semiconductor chip module is placed; connection pads located on an upper surface of the substrate body are electrically connected to the connection patterns, respectively; and
ball land patterns located on a lower surface of the substrate body, opposite the upper surface.

11. The stacked semiconductor package according to claim 10, wherein the semiconductor chip module comprises:
a first semiconductor chip module disposed on the upper surface of the substrate body;
a second semiconductor chip module disposed on the upper surface of the substrate body; and
a third semiconductor chip module disposed on the upper surface of the substrate body,
wherein the first and the second semiconductor chip modules are disposed on the substrate in the shape of pyramids, and the third semiconductor chip module is disposed on the substrate in the shape of an inverted pyramid.

12. The stacked semiconductor package according to claim 11, further comprising:
a printed circuit board electrically connected to a ball land patterns that is disposed over a top surface of the third semiconductor chip module; and
an additional semiconductor package connected to the printed circuit board.

13. The stacked semiconductor package according to claim 2, wherein the connection patterns further include connection members, which are connected to the ball land parts.

14. The stacked semiconductor package according to claim 1, further comprising:
a gap fill member, which fills a gap between the first and second semiconductor chip modules.

15. The stacked semiconductor package according to claim 6, wherein the first and second semiconductor chip modules comprise memory semiconductor chips, and the additional semiconductor package comprises system semiconductor chips.

16. The stacked semiconductor package according to claim 8, wherein the connection patterns further include connection members, which are connected to the ball land parts.

17. The stacked semiconductor package according to claim 7, further comprising:
a gap fill member, which fills a gap between the first and second semiconductor chip modules.

18. The stacked semiconductor package according to claim 12, wherein the first through third semiconductor chip modules comprise memory semiconductor modules for storing data, and the additional semiconductor package comprises a system semiconductor package for processing data.

* * * * *